(12) United States Patent
Bothwell et al.

(10) Patent No.: US 6,301,635 B2
(45) Date of Patent: *Oct. 9, 2001

(54) MEMORY DEVICE

(75) Inventors: Leslie Innes Bothwell, Alton; Andrew Blake, Guildford, both of (GB)

(73) Assignee: Nokia Mobile Phones Limited, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/937,986

(22) Filed: Sep. 26, 1997

(30) Foreign Application Priority Data

Sep. 30, 1996 (GB) .................................. 9620375

(51) Int. Cl.[7] .................................. G06F 12/00
(52) U.S. Cl. .................. 711/103; 711/143; 711/113
(58) Field of Search .................. 711/103, 143, 711/113, 134, 135; 712/37; 395/800.37; 365/185.33

(56) References Cited

U.S. PATENT DOCUMENTS

| 4,523,206 | * | 6/1985 | Sasscer | 711/113 |
|---|---|---|---|---|
| 4,916,605 | * | 4/1990 | Beardsley et al. | 711/118 |
| 5,175,842 | | 12/1992 | Totani | 395/425 |
| 5,297,148 | * | 3/1994 | Harari et al. | 365/185.09 |
| 5,315,638 | | 5/1994 | Mukari | 379/58 |
| 5,469,555 | * | 11/1995 | Ghosh et al. | 711/143 |
| 5,530,673 | * | 6/1996 | Tobita et al. | 365/185.09 |
| 5,542,066 | * | 7/1996 | Mattson et al. | 711/113 |
| 5,551,003 | * | 8/1996 | Mattson et al. | 711/112 |
| 5,581,726 | * | 12/1996 | Tanaka | 711/103 |
| 5,606,529 | * | 2/1997 | Honma et al. | 365/230.03 |
| 5,696,929 | * | 12/1997 | Hasbun et al. | 711/103 |
| 5,761,717 | * | 6/1998 | Vishlitzky et al. | 711/160 |
| 5,802,554 | * | 9/1998 | Caceres et al. | 711/103 |

FOREIGN PATENT DOCUMENTS

| 0391871 | 4/1989 | (EP) . |
|---|---|---|
| 0391871A3 | 4/1989 | (EP) . |
| 0392895 | 4/1989 | (EP) . |
| 0398654 | 11/1990 | (EP) . |
| WO 98/00846 | 6/1997 | (WO) . |

OTHER PUBLICATIONS

Wu, M. et al. "Envy: A Non–Volatile, Main Memory Storage System" ACM Sigplan Notices, vol. 29, No. 11, Nov. 1, 1994, pp. 86–97, XP000491727.

"Using Intel's Boot Block Flash Memory Parameter Blocks to Replace Eeprom", Application Note AF 604, Nov. 1995, Peter Hazen.

* cited by examiner

Primary Examiner—Do Hyun Yoo
Assistant Examiner—Yamir Encarnación
(74) Attorney, Agent, or Firm—Perman & Green, LLP

(57) ABSTRACT

A memory management method comprises storing parametric data in volatile memory such as RAM, and periodically updating the data stored in RAM to non-volatile memory such as Flash Memory. Updating of data to Flash Memory is dependent on the time since the last update or the importance of the data in the RAM.

19 Claims, 4 Drawing Sheets

MEMORY DEVICE

FIELD OF THE INVENTION

The present invention relates to a memory device and method of operation therefor. In particular, but not exclusively, the present invention relates to memory devices known as flash memory.

BACKGROUND OF INVENTION

Semiconductor or solid state memory devices comprise electrical signals or charges arranged to be representative of the data which is desired to be stored in the memory device. Memory devices which require power to be supplied to them in order that the electrical signals can be maintained, sometimes referred to as being refreshed, are known as volatile memories. Memory devices not requiring power to maintain the electrical signals are known as non-volatile memories. An early type of non-volatile memory is known as a Read Only Memory (ROM), in which the electrical signals or charges representative of data were created at the time of manufacturing the ROM and then the data represented by the electrical signals was read back when the device was in operation. The facility for a user to program a ROM and electrically erase data stored on the device and replace it with other data is possible with Electrically Erasable Programmable Read Only Memories (EEPROMs). Programming an EEPROMs is relatively slow since input/output of data and addressing is in a serial format. Additionally, special "high" voltages are required when programming the EEPROM. However, EEPROMs are particularly useful in portable electronic apparatus where user or system parameters are altered during use of the portable apparatus, and need to be stored when the apparatus is powered down for future use next time the portable apparatus is operating. Such a portable apparatus may be a radio telephone for example, where the parameters are for call counters/timers, last call stack, user settings for the user interface and user name and number memory for example. Such use may be referred to as a "write once/read many" type of application where the relative slowness during use and high power consumption during reprogramming does not mitigate against the use of EEPROMs for portable battery powered apparatus.

However, EEPROMs are typically only available in relatively small memory sizes such as 8 Kbyte or 16 Kbyte sizes, before they become prohibitively expensive. As more and more non-volatile memory space is required at lower power consumption for portable electronic apparatus, alternatives to EEPROM are required, Such an alternative is so-called Flash Memory which is available with large storage densities, for example 16 and 32 Mbit devices are commercially available. Flash memory is faster than EEPROM since it uses a parallel addressing and data format. Additionally, it has lower stand-by power consumption than EEPROM. Flash memory erases in blocks which are groups of bytes usually in multiples of 4K, 8K, 16K and so-forth. Erasing a block at a time usually makes reprogramming Flash Memory faster than reprogramming EEPROM, which is the origin of the term "flash". Nevertheless, a block erase takes a relatively long time, typically 0.5 seconds for an 8 Kbyte block.

The feature of block only erase has resulted in Flash Memory being used to store "linked list" data structures. Such a structure is described in Intel Corporation Application Note AP-604 for their Smart Voltage Boot Block Flash Memory Family. In these Flash Memory devices two so-called parameter blocks are provided for storing data that will change. Only one of the parameter blocks is in use at any one time. Each data record comprises a parameter value and a pointer to the next record for that parameter. If the parameter value for a record is the current value then the pointer is "empty" or given a value such as FFH indicating that there is no further record for the parameter. When a parameter value is updated the pointer for the previous current value is changed from "empty" to having the address of the record in which the new parameter value is to be stored. The new record has the new value stored in it, and an "empty" pointer.

Parameter values are stored in the linked list structure until the current parameter block is full. When this point is reached the latest value for each parameter is stored in the second parameter block, now the current parameter block, and the linked list structure continues in the new current block. The original current parameter block is then erased.

However, although Flash Memory addresses some of the problems and drawbacks associated with EEPROMs and the like, Flash Memory has its own drawbacks. During an erase cycle it is not possible to read from any block, whether or not that block is being erased, which is a significant disadvantage over EEPROM where data can be read or written to any individual byte. Additionally, the number of erase cycles which Flash Memory can undergo before degradation in performance occurs is limited to about 100,000 erase cycles, which is significantly less than the limitation on EEPROMs.

The present invention aims to ameliorate at least one of the problems or drawbacks experienced with flash memory devices.

SUMMARY OF INVENTION

In accordance with an embodiment of a first aspect of the present invention there is provided a memory management method comprising, storing electronic signals representative of parametric data in a volatile memory means, and storing in a non-volatile memory means electronic signals corresponding to the electronic signals representative of parametric data stored in the volatile memory means, said storing electronic signals in the non-volatile memory means being in dependence on the nature of the parametric data, for reducing wear of the non-volatile memory means.

An embodiment of the present invention has an advantage that non-volatile memory is not used each time a parameter or variable value is updated. Instead, volatile memory is used. This reduces wear of non-volatile memory. Additionally, since there are fewer parameter or variable value updates to the non-volatile memory than would otherwise be necessary, the performance of, for example a micro processor, is improved since typically it is quicker to read/write to volatile memory than non-volatile memory. Since non-volatile memory typically requires higher voltages than volatile memory for writing to the memory, an embodiment in accordance with the invention may use less power than conventional memory systems.

In a preferred embodiment of the present invention the electronic signals corresponding to the electronic signals representative of parametric data stored in the volatile memory means are stored in the non-volatile memory means dependent on storing the electronic signals in the non-volatile memory previously occurring concurrently with storing the electronic signals representative of parametric data in the volatile memory means. This addresses the problem that when data has been written to the volatile memory during writing of data to the non-volatile memory, the contents of the volatile and non-volatile memories may be different. In accordance with the preferred embodiment any inconsistency due to such overlapping may be resolved by updating the contents of the volatile memory to the non-volatile memory.

Preferably, the method further comprises the steps of determining a priority level for parametric data represented by the electronic signals stored in the volatile memory means, and initiating storing in the non-volatile memory means the electronic signals corresponding to the electronic signals representative of parametric data stored in the volatile memory means in accordance with a priority level for the parametric data. Typically, the parametric data is categorised having a first high level priority or a second low level priority thereby preferably updating the non-volatile memory important data stored in volatile memory. Optionally, all parametric data may have the same priority level and initiating storing in the non-volatile memory means may be determined by a suitable single criterion to balance likelihood of loss of data against number of stores to non-volatile memory.

Suitably, the method further comprises determining the expiration of a predetermined time period since storing the electronic signals representative of parametric data in volatile memory means, and initiating storing in a non-volatile memory means the electronic signals corresponding to the electronic signals representative of parametric data stored in the volatile memory means. Typically the predetermined time period is shorter for parametric data having the first high level priority than for parametric data having the second low level priority. Optionally, the method further comprises counting the number of occurrences of storing in the volatile memory means the electronic signals representative of the parametric data, determining the said number exceeding a predetermined threshold, and initiating storing in the non-volatile memory means the electronic signals corresponding to the electronic signals representative of parametric data stored in the volatile memory means. Typically, the predetermined threshold comprises a lower number of occurrences for parametric data having the first high level priority than for parametric data having the second low level priority.

In a second aspect of the present invention there is provided electronic apparatus, comprising
  a volatile memory means,
  a non-volatile memory means, and
  control circuitry, wherein the control circuitry is adaptable to store electronic signals representative of parametric data in the volatile memory means, and store in the non-volatile memory means electronic signals corresponding to electronic signals representative of parametric data stored in the volatile memory means in dependence on the nature of the parametric data.

In a third aspect of the invention there is provided electronic apparatus for controlling storing electronic signals in volatile memory means and non-volatile memory means by a computer processor programmed in accordance with the foregoing described methods.

In a fourth aspect of the invention there is provided a storage medium for storing machine-readable instructions for controlling storing electronic signals in volatile memory means and non-volatile memory means in accordance with the foregoing described methods.

DETAILED DESCRIPTION OF EMBODIMENTS OF THE INVENTION

Embodiments in accordance with the present invention will now be described, by way of example only, and with reference to the accompanying drawings.

Figure 1:
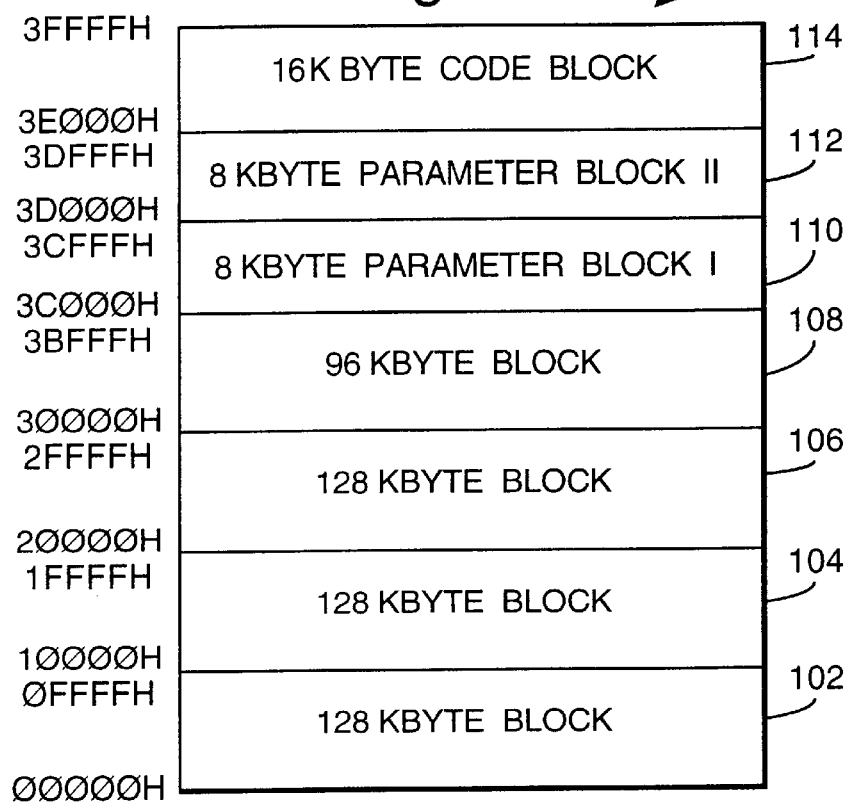
FIG. 1 shows a typical Flash Memory map.

Intel Corporation 4-Mbit Smart Voltage Boot Block Flash Memory is described in application note AP-604 published November 1995. A memory map for the Intel 4-Mbit Flash Memory is shown in FIG. 1. Intel's 4-Mbit Flash Memory 100 is divided into blocks, each block having a fixed address range. Blocks 102, 104 and 106 are 128 Kbyte blocks extending between addresses 00000H to 30000H. Additionally, there is a 96 Kbyte block 108 extending between address 30000H and 3BFFFH. Flash Memory blocks 102, 104, 106 and 108 comprise main memory blocks and are typically used to store data or information which is not going to change or is unlikely to change during use of the Flash Memory 100. Such data or information may be application software or a program for operating a device where only occasional software upgrades or updates required. The Intel 4-Mbyte Flash Memory also comprises two 8 Kbyte parameter blocks 110 and 112. Parameter block I, 110, extends between addresses 3C000H and 3CFFFH, and parameter block II, 112, extends between addresses 3D000H and 3DFFFH. Parameter block I and parameter block II, 110 and 112, are blocks of Flash Memory reserved for storing data which is typically up-dated during operation of the Flash Memory 100. For example, the data may be parameters relating to the operation of the electronic apparatus in which the Flash Memory 100 is situated. If this was a portable radio telephone for example, such information may relate to the user interface set-up, the user personal telephone directory or some other parameter of the radio telephone which varies during use and must be retained during power down of the radio telephone. The final memory block, block 114, is a code block and is suitably reserved for storing software necessary to initialise the operating system of a electronic apparatus for example, and to provide for the recovery of a system in the event of application code catastrophically failing. Additionally, code block 114 typically stores the code necessary to program and erase the Flash Memory. Code block 114 is often referred to as a boot block and occupies the highest region of memory, address 3E000H to 3FFFFH.

In common with other semi-conductor memories, Flash Memory stores data as electronic signals. The data is stored as binary information, that is to say the information or stored data represents either a "1" or "0". It is a characteristic of Flash Memory that it is only possible to write (or program) information to the Flash Memory by changing "1"s to "0"s. Thus, Flash Memory is initialised ready for writing (or programming) by filling each memory location with "1"s. To erase Flash Memory "0"s are changed to "1"s. Additionally, it is a characteristic of Flash Memory that erase processes are carried out on a block by block basis. Referring to FIG. 1, an erase process or cycle would have to take place on one of blocks 102 to 114. It is not possible to selectively erase information within a block; all of the information in that block has to be erased. A block erase only erases information in the one block, all other blocks are unaffected. An erase cycle is typically defined as an erase operation followed by a writing or programming operation, or visa versa. Reading from Flash Memory is carried out in a relatively conventional manner by first addressing the location it is desired to read data from, and then reading that data. It is a feature of the Intel 4 M-byte Smart Voltage Boot Block Flash Memory that it is only specified to work over 100,000 erase cycles when operating at a 5 volt power supply within a standard temperature range, and only 10,000 cycles for an extended temperature range. This upper limit on the specified number of cycles may be a limitation to utilisation of such Flash Memory devices in some types of electronic apparatus.

Figure 2:
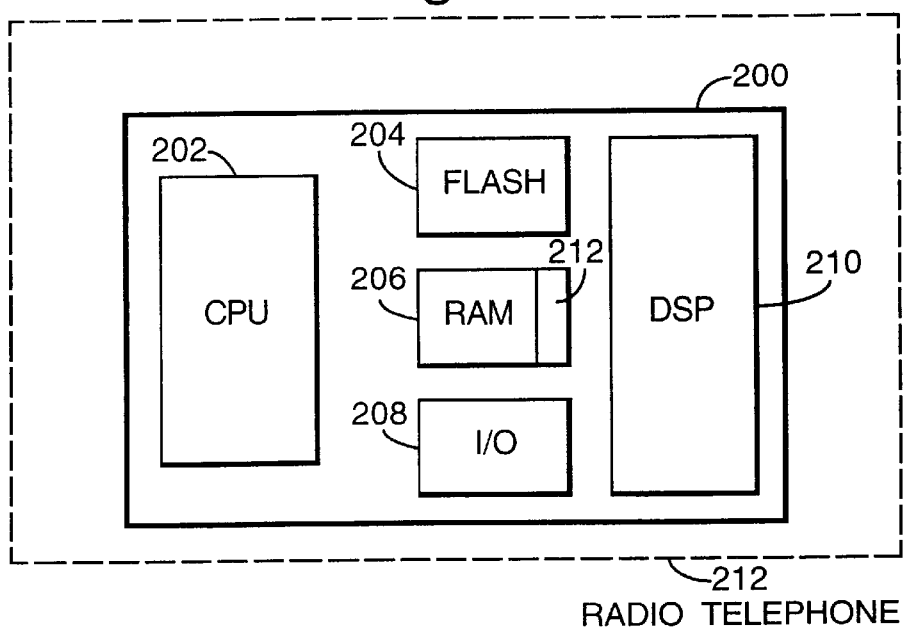
FIG. 2 shows a block diagram of a VLSI microcontroller.

Referring now to FIG. 2, there is shown a block diagram of a micro-controller 200 having a multiplicity of integrated on-board functioning units. Micro-controller 200 comprises a CPU 202, Flash Memory 204, Random Access Memory (RAM) 206, input/output drivers 208 and Digital Signal Processor (DSP) 210. CPU 202 may be a conventional processor unit having the normal functions associated with such processors and interacting with other functional units within the micro-controller 200, and on signals supplied to the micro-controller 200 from electronic apparatus associated with the micro-controller. Input/output driver 208 handles transfer of data between individual functional units on board the micro-controller 200 as well as handling data flow between the units of micro-controller 200 and external electronic apparatus. As integration becomes greater and greater it is not uncommon to find sophisticated functional units on board a micro-controller such as DSP 210 suitably programmed to carry out vocoding functions, for example in a radiotelephone. Typically micro-controller 200 also has on-board various types of memory. Flash Memory 204 provides non-volatile memory means and is often used as a replacement for and emulates EEPROM, and RAM 206 provides volatile memory means and is usually provided to serve its normal function such as scratch pad memory or for use in association with any software running in the CPU.

Flash Memory 204 typically has stored in memory block 114 instructions for CPU 202 to perform writing and erasing of the Flash Memory 204. However, since the Flash Memory is not able to read from one address location whilst writing to another address location within the same device, any instruction that involves writing to a Flash Memory location must first be temporarily stored in RAM 206 in order that the code may be executed to perform the writing process. Since the erase process is a process of changing "0"s to "1"s, i.e. a form of "writing", erase cycle instructions must also be temporarily downloaded to RAM before the erase cycle begins.

In accordance with a preferred embodiment of the invention RAM 206 comprises an 8 Kbyte block, hereinafter referred to as 8K RAM cache, for interim storage of parameters or variables which are to be stored in one of Flash Memory parameter blocks 110, 112. CPU 202 is conditioned in accordance with a set of machine-readable instructions known as a Flash Memory Manager (FMM) to provide means to manage efficient use of the Flash Memory. A set of machine-readable instructions known as FMM-RAM Cache Routine are provided for controlling the storage of parameters in and between RAM cache 212 and parameter blocks 110 and 112. Typically, FMM instructions such as FMM-RAM Cache Routine instructions are stored in main memory blocks 102 to 108 of Flash Memory 200, and may be downloaded to RAM 206 if the FMM instructions are to comprise writing or erasing of a block of Flash Memory, in particular of one or other of parameter blocks 110, 112.

Figure 3:
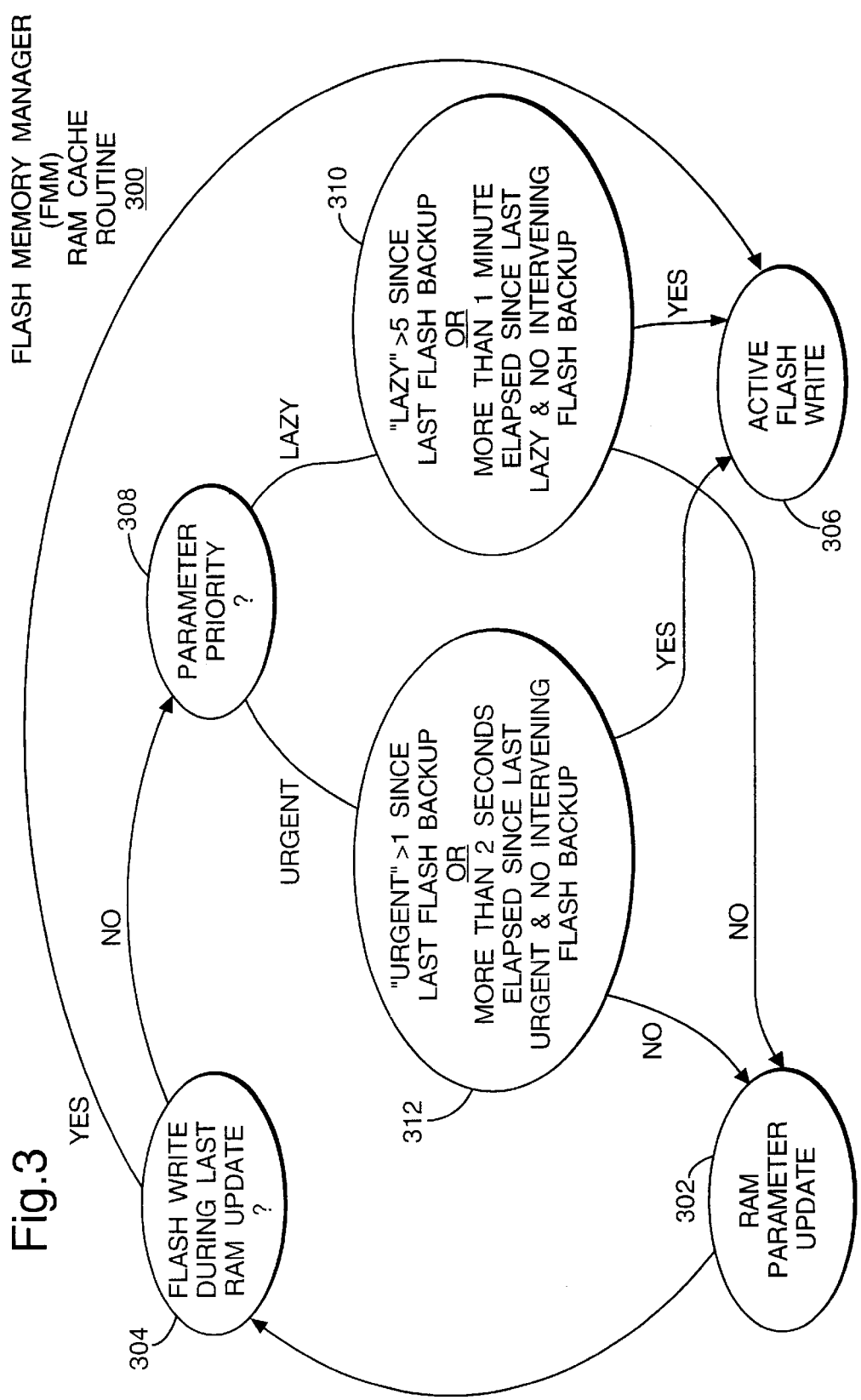
FIG. 3 shows a flow chart for a Flash Memory Manager RAM Cache Routine in accordance with a preferred embodiment of the invention.

Referring to FIG. 3, there is shown a flowchart 300 in accordance with a preferred embodiment of the invention for the operation of CPU 202 conditioned in accordance with FMM-RAM Cache Routine instructions. When a parameter stored in the currently active flash parameter block, 110 for example, of Flash Memory 100 is changed, altered or updated the FMM 300 enters state 302 in which a corresponding parameter stored in RAM cache 212 is updated with the new parameter value. FMM 300 then proceeds to state 304 where it is determined whether or not any updating of RAM cache 212 has occurred during a write to the currently active flash parameter block 110. If a RAM cache update has occurred during a flash write then FMM 300 enters state 306 where the currently active flash parameter block 110 has the contents of RAM cache 212 written to it in order to update RAM cache 212 to the currently active flash parameter block 110. This takes account of any inconsistencies between parameter values stored in the RAM cache 212 and the currently active flash parameter block 110 due to there being a write to RAM cache 212 during a flash write which may have caused the currently active flash parameter block 110 to then have partly old data and partly new data stored in it. If state 304 is NO then FMM 300 enters state 308 where the priority of the parameter currently updated in RAM is determined. It should be noted that in accordance with the invention the parameters are either designated "urgent" or "lazy" parameters depending upon their importance to the operation of the electronic apparatus in which the Flash Memory or micro-controller resides. Which parameters are "urgent" and which are "lazy", and how such priorities are distributed amongst the various parameters for the electronic apparatus is not relevant to the instant invention. It is merely necessary to note that parameters having those respective two levels of priority exist within the system and are capable of being identified as having such priorities. Clearly, there may be more than two levels of priority in any system and FMM 300 may be suitably altered to accommodate other levels of priority. If the current parameter has a "lazy" priority then FMM 300 enters state 310 and if the current parameter has an "urgent" priority then FMM 300 enters state 312. During state 310 if more than five "lazy" parameters have been written to RAM cache 212 since the last flash back-up OR it has been more than one minute since the last "lazy" parameter was written to RAM cache 212 and there have been no intervening flash back-ups then FMM 300 enters state 306 where the currently active flash parameter block 110 has the contents of RAM cache 212 written to it in order to back-up the RAM cache 212. If state 310 is NO then the FMM 300 enters state 302 where it waits for the next parameter to be up-dated to the RAM cache 212. In state 312 if more than one urgent parameter has been written to the RAM cache 212 since the last flash back-up OR it has been two seconds since the last urgent parameter was written to RAM cache 212 and there has been no interim back-up to flash then FMM 300 enters state 306 where the contents of RAM cache 212 is backed-up to the currently active flash memory parameter block 110. If state 312 is NO then FMM 300 enters state 302 where the process waits for the next parameter to be up-dated in RAM cache 212.

It will be clear to a person skilled in the art that the criteria in respective states 310 and 312 need not be as specifically described, but may be varied to take into account the nature and priority of the parameters for any particular electronic apparatus.

As is clear from the flowchart of FIG. 3, FMM 300 has states which require writing to the active flash memory parameter block 110, and states which do not require such writing. Consequently, it is possible that not all of the instructions relating to FMM 300 need be downloaded from Flash Memory to RAM 206 when CPU 202 is to be conditioned to operate in accordance with FMM 300, but only that part of FMM 300 instructions which initiate a "write" to Flash Memory parameter block 110.

Since Flash Memory cannot be individually erased, each subsequent back-up with contents of RAM cache 212 is written to the next available address within the active Flash Memory parameter block 110. A linked list data structure as described before is particularly suitable for this purpose Eventually, the currently active Flash Memory parameter block 110 becomes full. Then the most up to date values for the parameters stored in the currently active Flash Memory parameter block 110 are then stored in the second Flash Memory parameter memory block 112. The second Flash Memory parameter block now becomes the currently active parameter block and the contents of RAM cache 212 are now up-dated to the new currently active parameter block 112 under the control of FMM 300. At a convenient point in the operation of the electronic apparatus, the original active parameter block 110 is erased,. i.e. all memory locations filled with "1"s, and made ready for receiving updated parameter values when the currently active parameter block 112 becomes full.

Flash Memory managed by FMM-RAM cache routine in accordance with the preferred embodiment of the present invention is capable of having effectively longer use since it is not necessarily up-dated for every change in parameter value but only when there have been certain numbers of parameter up-dates or when the parameter is sufficiently important for it to be saved to Flash Memory promptly. Thus, more parameter up-dates are available than would be available with a conventionally managed Flash Memory.

During the operation of electronic apparatus controlled by a central processor unit such as CPU 202, information has to be read from memory devices such as Flash Memory 204 and RAM 206. However, as described above it is not possible to read from Flash Memory 204 during a write to or erase of a block of the Flash Memory. Thus, if a request by the CPU to read data from Flash Memory 204 occurs during a write or erase the request will be denied. Such requests are hereinafter referred to as Interrupts.

Depending upon the type of electronic apparatus and its state, the apparatus will cease to function correctly if Interrupts or at least certain types of Interrupt, are not serviced promptly. For an erase the delay may be up to 2 seconds for an 8K block, which is typically far too long a delay before servicing an Interrupt.

Figure 4:
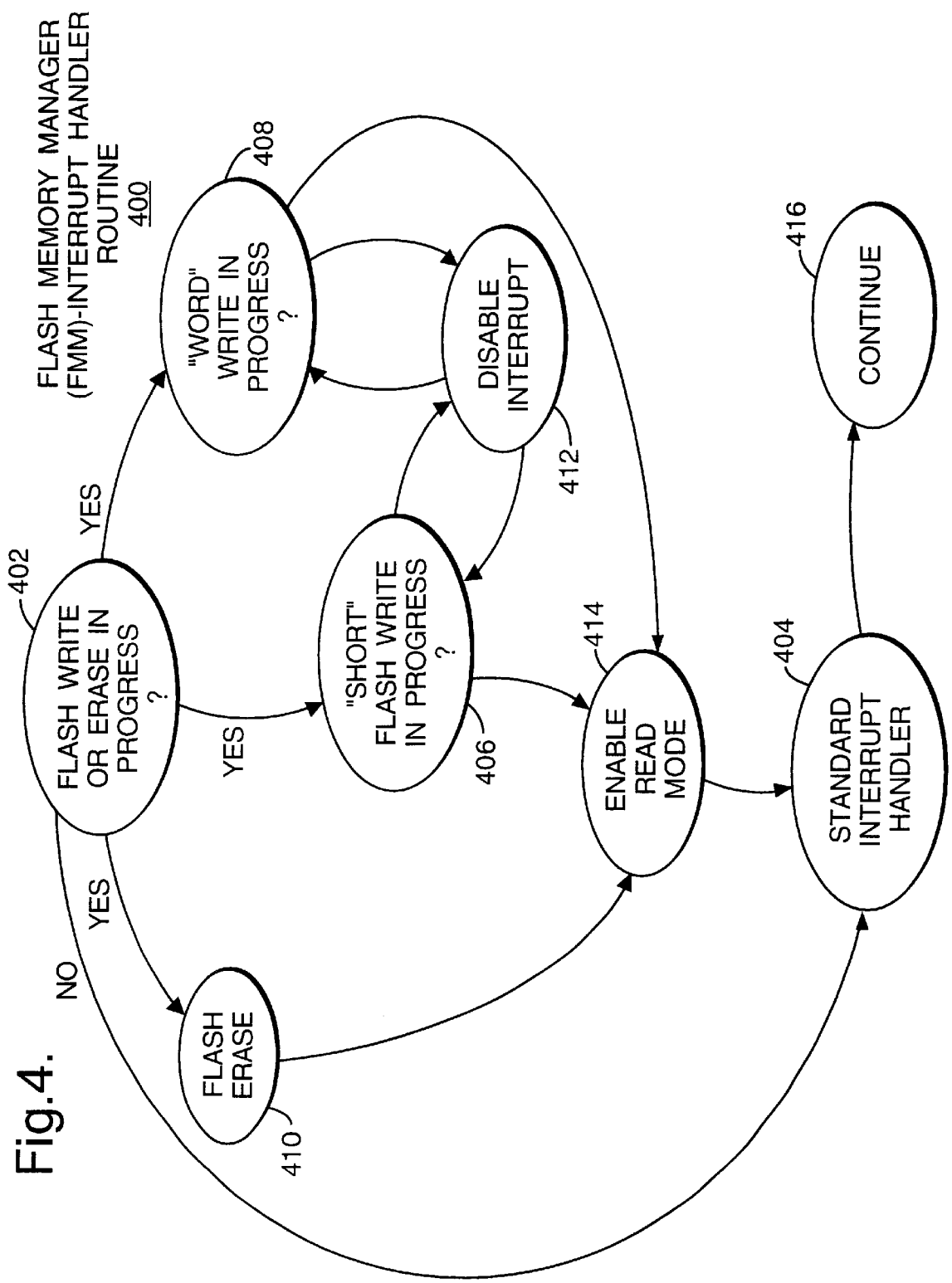
FIG. 4 shows a flow chart for a Flash Memory Manager Interrupt Handling routine.

Referring now to FIG. 4, there is shown a flow chart for a Flash File Manager (FMM) Interrupt Handler Routine 400. CPU 202 may be conditioned to operate in accordance with FMM Interrupt Handier Routine 400. When an Interrupt occurs which requires access to Flash Memory 204 FMM Interrupt Handler 400 is invoked. FMM Interrupt Handler determines at state 402 whether the Flash Memory 204 is currently undergoing a write or erase operation. If no such operation is in progress then state 404 is entered in which the system standard interrupt handler routine is initiated. Standard interrupt handling routines are well known to a skilled person and no detailed description of them is necessary. The standard interrupt handler services the interrupt request in a conventional manner, reading from whatever data locations are necessary. If a write or erase is in progress then if a "short" write to Flash Memory 204 is in progress FMM Interrupt Handier 400 enters state 406, if a "long" write, e.g. a word write, is in progress state 408 is entered, and if an erase is in progress state 410 is entered.

For a short write to Flash Memory 204, state 406, Interrupt Handler 400 enters state 412 where the interrupt is disabled. When the "short" write i s completed then Interrupt Handler 400 enters state 414 in which the Flash Memory 204 block read mode is enabled. The Interrupt Handier then enters state 404 in which the Standard Interrupt Handler is invoked. The maximum duration for a write to qualify as a "short" write is typically dependent on the nature of the electronic apparatus controlled by and the instructions running on CPU 202, and may be suitably determined by a person skilled in the art. Generally, a write of less than six, machine cycles or one instruction may be considered a "short" write.

If a "long" write, i.e. comprising many "words", is in progress then Interrupt Handler 400 enters state 408 and determines if a word (typically 8 or 16 bits) is currently being written to Flash Memory 204. If not then the Interrupt Handler 400 goes to state 414 where the block read mode is entered for Flash Memory 204, and then state 404 is entered where the standard interrupt handler is invoked. If a word is currently being written to Flash Memory 204, then state 412 is entered and the interrupt disabled until such time as the word write ceases. Then state 414 is entered and the block read mode enabled, and standard interrupt handler invoked at state 404. Optionally, interrupts may be enabled in between word writes since there is typically a pause between word writes for the new word to be placed into a data buffer or the address for writing the new word to be loaded. Thus, if an interrupt occurs during such an enabled period the FMM Interrupt Handler can place the Flash Memory 204 into read mode in order that the interrupt may be serviced. The FMM Interrupt Handler may determine when the "long" write is between word writes and then place Flash Memory 204 into the read mode; or note when a "long" write is likely to be between word writes.

If FMM Interrupt Handler 400 enters state 410, where an erase in progress has been detected, the erase process is halted and the block read mode enabled, state 414. The Standard Interrupt Handler is invoked at state 404.

From state 404, FMM Interrupt Handler 400 enters state 416 which is a continuation of the operation being performed prior to the Interrupt Handler being invoked. For example, if an erase was in progress then in state 416 the erase continues from where it was halted to service the interrupt. Similarly, if a "long" write was in progress and interrupted, then the next word write is performed in state 416.

FMM Interrupt Handler 400 may be stored in Flash Memory 204, but when a flash erase or write operation is to be performed it is temporarily transferred to RAM 206. Optionally, Interrupt Handler 400 may be preferably stored in RAM 206. Whether only temporarily or preferably stored in RAM, interrupt requests must be vectored to the RAM address containing FMM Interrupt Handler 400.

As described earlier Flash Memory 204 has a finite number of erase cycles which can be performed before there is a degradation of performance of the Flash Memory. Flash Memory Manager provides a set of machine-readable instructions known as FMM Block Re-use Policy to CPU 202 to provide means for re-using flash memory blocks evenly so that all blocks get approximately the same wear for each block.

Figure 5:
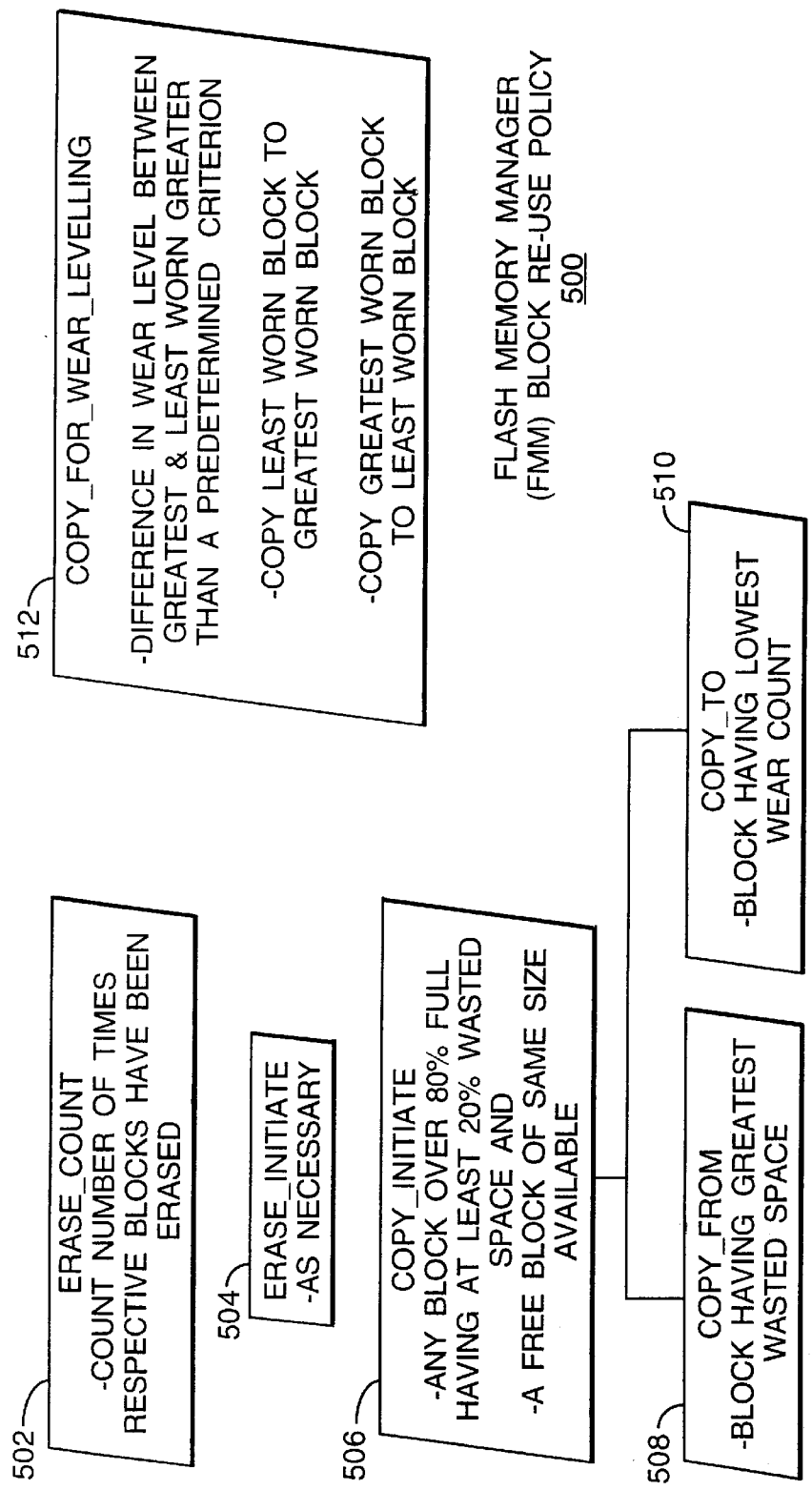
FIG. 5 shows a schematic representation of a Flash Memory Manager Block Copy Policy.

Referring now to FIG. 5, there is shown a schematic representation of FMM Block Re-use Policy. CPU 202 may be conditioned to operate in accordance with FMM Block Re-use Policy. The Block Re-use Policy comprises a set of sub routines labelled erase_count 502, erase_initiate 504, copy_initiate 506, copy_from 508, copy_to 510 and copy_for_wear_levelling 512.

Erase_count sub routine 502, keeps track of how many times a block has been erased. The number of times a block has been erased is known as the block wear count. The block wear count is initialised at 0 the first time the flash memory is used. That is to say the first time that the Flash Memory Manager runs in the electronic apparatus in which the Flash Memory 204 resides. There is a block wear count for each block of Flash Memory, and the block wear count is incremented each time a corresponding block is erased. Generally a block is erased so that another block may be copied into it. Thus, block wear count for the block being erased may be stored in the block from which the copy is to be made whilst the block to which the copy is to be made is being erased.

Eraser_initiate sub routine 504 controls the operation of erase processes within the Flash Memory 204. Typically, blocks that can be erased will be erased, such erasing only being interrupted when the Flash Memory Manager requires such interruption due to the need to service interrupt requests from CPU 202.

Initiation of a copy is controlled by machine-readable instructions in accordance with copy_initiate sub routine 506. The criteria for initiating a block copy from a nearly full block to an unused block is that:

at least one block is over 80% full and has at least 20% wasted space in it. AND a free block of the same size is available.

Other conditions or criteria may be determined by a person skilled in the art to adapt copy_initiate sub routine 506 to a particular electronic apparatus or micro controller/ instruction set architecture.

When the conditions for fulfilling the criteria in copy_initiate sub routine 506 are met, copy_from sub routine 508 and copy_to sub routine 510 are invoked. Copy_from sub routine 508 causes the contents of the block with the greatest wasted space to be copied from. Typically, when copy_from sub routine 608 is invoked there is normally more than one candidate block to copy from. For example, if there are eight 8 Kbyte blocks of which six blocks are full:

One having 90% wasted space with a wear count of thirty,

One having 80% wasted space with a wear count of twenty,

One having 50% wasted space with a wear count of nine,

One having 45% wasted space with a wear count of three,

One having 30% wasted space with a wear count of two, and the final one having 10% wasted space. One of the blocks being erased and the final block has been erased.

In accordance with the criteria in copy_from sub routine 508 the candidate for which copies are to be made is that with the 90% wasted space. However, this block has the highest wear count. It is an option that a trade-off may be made between the wear count and the percentage wastage. For example, the higher the percentage wasted, the better use of memory resources and increased time to next block copy, due to the greatest space being freed. If the block with the greatest wasted space is not chosen, the implication is that the next copy will happen sooner and hence produce a block copy requirement sooner and therefore introduce wear sooner. It should be noted that the term "wasted space" refers to memory locations which store parameter values which have been updated, such that the updated value is in a different memory location.

Since each flash block can be erased and re-written 100,000 times, the wear count is a low factor in the decision as to which block a copy should be made from. Hence in the specific embodiment copy_from sub routine 508 ignores the wear count and uses the simple criteria that the block to be copied is that with the greatest wasted space. That is not to say, that a person skilled in the art would not wish to utilise a trade off between wear count and percentage wasted space to optimise utilisation of a flash memory device within a particular environment.

When copy_to policy 510 is invoked, there is typically more than one candidate memory block in which to copy to. For example, taking eight 8 Kbyte blocks four of which are full, one of which has data which has already been copied to another block, one is being erased and two have been erased, only two blocks are immediately available for use. That is to say the two memory blocks which have already been erased. Each of these two blocks will have a block wear count. The criteria for copy_to sub routine 510 is that the first block to be copied to will be the block with the lowest wear count.

In certain types of application it is possible that some flash memory blocks never or rarely get erased. For example, an application may save two large records to a memory block and never remove or write them. In such a situation, this particular block would not wear out whereas the other blocks in the Flash Memory would wear out. Copy_for_wear_levelling_only sub routine 512 is adapted to identify any major discrepancy between the wear values of blocks within the Flash Memory and force a block copy from a relatively unworn block to the most worn block and vice versa. In this way the little worn block becomes heavily used and wear on the heavily worn block is substantially reduced. The forced copy occurs when the difference between the wear level in the least used block and the wear level in the most used block exceeds a predetermined value. This value is dependent upon the applications which are using the flash memory but would typically be in the range of 1–40%. Modifications to this range may be made depending on the write/erase frequency for the Flash Memory such that high write/erase use would cause forced copy to occur more often. Additionally, as the wear count increases for blocks then forced copy would occur more often. Forced copy may be made adjustable to take into account the foregoing criteria, even on a block basis.

In view of the foregoing description it will be evident to a person skilled in the art that various modifications may be made within the scope of the invention, for example, as mentioned earlier there may be more than two priority levels for parameters and the criteria for determining whether or not the RAM cache 212 is backed-up to Flash Memory 100 may be adapted to suit the electronic apparatus in which micro-controller 200 and Flash Memory 100 resides. For example, a further state may exist in the FMM 300 which detects initiation of power down of portable electronic apparatus and prior to power down backs up the RAM cache 212 to the currently active Flash Memory parameter block.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What we claim is:

1. A memory management method, for use with a combination of volatile memory means and Flash Memory type non-volatile memory means, comprising the steps of:

storing first electronic signals representative of parametric data that has priority data fixed thereto associated with one of at least two particular levels of priority in a volatile memory means;

storing, in a non-volatile memory means of the Flash Memory type, second electronic signals corresponding to the first electronic signals representative of parametric data stored in the volatile memory means;

determining from said fixed priority data the particular priority level associated with the parametric data represented by the first electronic signals being stored in the volatile memory; and storing said second electronic signals in the non-volatile memory means in dependence on the priority level determined to be associated with the parametric data, with the highest priority being stored first, thereby reducing wear on the non-volatile memory means.

2. A method according to claim 1, wherein the second electronic signals are stored in the non-volatile memory means dependent on the storing of electronic signals in the non-volatile memory previously occurring concurrently with the storing of the first electronic signals.

3. A method according to claim 1, further comprising the steps of determining the expiration of a predetermined time period since storing the first electronic signals, and then initiating the storing in the non-volatile memory means of the second electronic signals.

4. A method according to claim 1, wherein the parametric data is categorized by said priority data as having a first high level priority or a second low level priority.

5. A method according to claim 4, further comprising the steps of:

counting the number of occurrences of storing in the volatile memory means of the first electronic signals;

determining the number of said occurrences exceeding a predetermined threshold; and initiating the storing in the non-volatile memory means of the second electronic signals when the threshold is exceeded.

6. A method, for use with a combination of volatile and non-volatile memory means, comprising the steps of:

storing, in a volatile memory means, first electronic signals representative of parametric data having priority data fixed thereto indicative of one of at least two particular levels of priority associated therewith;

storing, in a non-volatile memory means, second electronic signals corresponding to said first electronic signals;

determining the particular priority level, using said fixed priority data, for the parametric data represented by the first electronic signals stored in the volatile memory means; and initiating storing in the non-volatile memory means of the second electronic signals in accordance with the determined priority level for the parametric data.

7. A method according to claim 6, wherein the parametric data is categorized as having a first high level priority or a second low level priority by the priority data.

8. A method according to claim 7, further comprising the steps of:

counting the number of occurrences of storing in the volatile memory means of the first electronic signals;

determining the number of said occurrences exceeding a predetermined threshold; and initiating the storing in the non-volatile memory means of the second electronic signals when the threshold is exceeded.

9. A method according to claim 6, wherein the second electronic signals are stored in the non-volatile memory means dependent on the storing of electronic signals in the non-volatile memory previously occurring concurrently with the storing of the first electronic signals.

10. A memory management method comprising, the steps of:

storing first electronic signals representative of parametric data associated with one of at least two levels of priority in a volatile memory means;

storing in a non-volatile memory means second electronic signals corresponding to the first electronic signals representative of parametric data stored in the volatile memory means;

determining the priority level associated with the parametric data represented by the first electronic signals being stored in the volatile memory;

storing said second electronic signals in the non-volatile memory means in dependence on the priority level determined to be associated with the parametric data, with the highest priority being stored first, thereby reducing wear on the non-volatile memory means;

determining the expiration of a predetermined time period since storing the first electronic signals, and initiating the storing in a non-volatile memory means of the second electronic signals; and categorizing the parametric data as having a first high level priority or a second low level priority and the predetermined time period is shorter for parametric data having the first high level priority than for parametric data having the second low level priority.

11. A method comprising the steps of:

storing, in a volatile memory means, first electronic signals representative of parametric data having one of at least two levels of priority associated therewith;

storing, in a non-volatile memory means, second electronic signals corresponding to said first electronic signals;

determining a priority level for the parametric data represented by the first electronic signals stored in the volatile memory means, initiating storing in the non-volatile memory means of the second electronic signals in accordance with the determined priority level for the parametric data;

categorizing the parametric data as having a first high level priority or a second low level priority;

counting the number of occurrences of storing in the volatile memory means of the first electronic signals;

determining the number of said occurrences exceeding a predetermined threshold;

initiating the storing in the non-volatile memory means of the second electronic signals when the threshold is exceeded; and wherein the predetermined threshold comprises a lower number of occurrences for parametric data having the first high level priority than for parametric data having the second low level priority.

12. Electronic apparatus, comprising:

a volatile memory means;

a Flash Memory type non-volatile memory means; and control circuitry, for controlling the storing of first electronic signals, which signals are representative of parametric data having priority data fixed thereto associated with one of at least two particular levels of priority in the volatile memory means, and the storing in the non-volatile memory means of second electronic signals corresponding to the first electronic signals, said control circuitry determining from said fixed priority data the priority level associated with the parametric data and storing the second electronic signals in the non-volatile memory means in dependence on the priority level determined to be associated with the parametric data.

13. Electronic apparatus according to claim 12, further comprising means for determining the expiration of a predetermined time period since storing the first electronic signals before initiating the storing in the non-volatile memory means of the second electronic signals.

14. Electronic apparatus for controlling the storing of electronic signals in a volatile memory means and a non-volatile memory means by a computer processor comprising:

means for storing first electronic signals representative of parametric data that has priority data fixed thereto associated with one of at least two particular levels of priority in the volatile memory means, means for storing second electronic signals corresponding to the first electronic signals in the non-volatile memory means, and a controller that determines from said fixed priority data the particular priority level associated with the parametric data and causes storing of said second electronic signals in the non-volatile memory means to be in dependence on the priority level determined to be associated with the parametric data, with the highest priority being stored first.

15. Electronic apparatus according to claim 14, further comprising means for determining the expiration of a predetermined time period since storing the first electronic signals before initiating the storing in the non-volatile memory means of the second electronic signals.

16. A storage medium, for storing machine-readable instructions, having a controller for controlling the storing of electronic signals in a volatile memory means and a non-volatile memory means, said medium comprising:

volatile memory means for storing first electronic signals representative of parametric data having priority data fixed thereto associated with one level of at least two particular levels of priority;

non-volatile memory means for storing second electronic signals corresponding to the first electronic signals;

and wherein said controller determines from said priority data the particular priority level associated with the parametric data and causes the storing of said second electronic signals in the non-volatile memory means to be in dependence on the priority level determined to be associated with the parametric data, with the highest priority being stored first.

17. A storage medium according to claim 16, further comprising means for determining the expiration of a predetermined time period since storing the first electronic signals before initiating the storing in the non-volatile memory means of the second electronic signals.

18. Electronic apparatus, comprising:

a volatile memory means;

a non-volatile memory means;

control circuitry, for controlling the storing of first electronic signals, representative of parametric data associated with one of at least two levels of priority in the volatile memory means, and the storing in the non-volatile memory means of second electronic signals corresponding to the first electronic signals, said control circuitry determining the priority associated with the parametric data and storing the second electronic signals in the non-volatile memory means in dependence on the priority determined to be associated with the parametric data;

means for determining the expiration of a predetermined time period since storing the first electronic signals before initiating the storing in the non-volatile memory means of the second electronic signals; and wherein the parametric data is categorized as having a first high level priority or a second low level priority and the predetermined time period is shorter for parametric data having the first high level priority than for parametric data having the second low level priority.

19. Electronic apparatus, comprising:

a volatile memory means;

a non-volatile memory means;

control circuitry, for controlling the storing of first electronic signals, representative of parametric data associated with one of at least two levels of priority in the volatile memory means, and the storing in the non-volatile memory means of second electronic signals corresponding to the first electronic signals, said control circuitry determining the priority associated with the parametric data and storing the second electronic signals in the non-volatile memory means in dependence on the priority determined to be associated with the parametric data;

means for counting the number of occurrences of storing in the volatile memory means of the first electronic signals;

means for determining said number of occurrences exceeding a predetermined threshold; and means for initiating the storing in the non-volatile memory means of the second electronic signals when the threshold is exceeded; and wherein the predetermined threshold comprises a lower number of occurrences for parametric data having a first high level priority than for parametric data having a second low level priority.

* * * * *